United States Patent
Narayanan et al.

(10) Patent No.: US 10,693,062 B2
(45) Date of Patent: Jun. 23, 2020

(54) REGULATING INTERFACE LAYER FORMATION FOR TWO-TERMINAL MEMORY

(71) Applicant: Crossbar, Inc., Santa Clara, CA (US)

(72) Inventors: Sundar Narayanan, Cupertino, CA (US); Sung Hyun Jo, Sunnyvale, CA (US); Liang Zhao, Santa Clara, CA (US)

(73) Assignee: Crossbar, Inc., Santa Clara, CA (US)

(*) Notice: Subject to any disclaimer, the term of this patent is extended or adjusted under 35 U.S.C. 154(b) by 0 days.

(21) Appl. No.: 15/370,561

(22) Filed: Dec. 6, 2016

(65) Prior Publication Data
US 2017/0162783 A1 Jun. 8, 2017

Related U.S. Application Data

(60) Provisional application No. 62/264,779, filed on Dec. 8, 2015.

(51) Int. Cl.
*H01L 45/00* (2006.01)
*H01L 27/24* (2006.01)

(52) U.S. Cl.
CPC ........ *H01L 45/085* (2013.01); *H01L 27/2436* (2013.01); *H01L 45/1233* (2013.01); *H01L 45/1246* (2013.01); *H01L 45/1266* (2013.01); *H01L 45/145* (2013.01); *H01L 45/1616* (2013.01); *H01L 45/1675* (2013.01)

(58) Field of Classification Search
CPC . H01L 45/145; H01L 45/085; H01L 45/1608; H01L 45/1616; H01L 45/1625; H01L 45/1633; H01L 21/0217
See application file for complete search history.

(56) References Cited

U.S. PATENT DOCUMENTS

| | | | |
|---|---|---|---|
| 7,927,472 B2 | 4/2011 | Takahashi et al. | |
| 8,426,839 B1 * | 4/2013 | Ma | H01L 45/085 257/3 |
| 8,796,102 B1 * | 8/2014 | Clark | H01L 45/08 257/3 |

(Continued)

FOREIGN PATENT DOCUMENTS

| CN | 101174671 A | 5/2008 |
|---|---|---|
| CN | 101814578 A | 8/2010 |

(Continued)

OTHER PUBLICATIONS

R. N. Ghoshtagore, "Diffusion of Nickel in Amorphous Silicon Dioxide and Silicon Nitride Films," Journal of Applied Physics, vol. 40, No. 11, pp. 4374-4376, Oct. 1969.*

(Continued)

*Primary Examiner* — Cuong Q Nguyen
*Assistant Examiner* — Peter M Albrecht
(74) *Attorney, Agent, or Firm* — Wegman Hessler

(57) ABSTRACT

Provision of fabrication, construction, and/or assembly of a two-terminal memory device is described herein. The two-terminal memory device can include an active region with a silicon bearing layer, an interface layer, and an active metal layer. The interface layer can be grown on the silicon bearing layer, and the growth of the interface layer can be regulated with $N_2O$ plasma.

20 Claims, 11 Drawing Sheets

520 — HIGH-TEMPERATURE BAKE PROCESS (e.g., 400-450°C)

(56) References Cited

U.S. PATENT DOCUMENTS

| | | | |
|---|---|---|---|
| 8,912,516 B2* | 12/2014 | Ohba | H01L 45/16 257/2 |
| 8,946,673 B1 | 2/2015 | Kumar | |
| 9,142,764 B1 | 9/2015 | Wang | |
| 9,553,263 B1* | 1/2017 | Petz | C23C 14/08 |
| 2003/0052330 A1* | 3/2003 | Klein | C23C 18/165 257/154 |
| 2004/0038480 A1* | 2/2004 | Moore | H01L 45/085 438/257 |
| 2006/0084236 A1* | 4/2006 | Vogt | C23C 16/308 438/381 |
| 2007/0026620 A1* | 2/2007 | Yamada | B82Y 20/00 438/308 |
| 2008/0116540 A1* | 5/2008 | Wang | H01L 27/101 257/530 |
| 2011/0183525 A1 | 7/2011 | Purushothaman et al. | |
| 2011/0198556 A1* | 8/2011 | Yamamoto | H01L 27/2409 257/4 |
| 2012/0091420 A1* | 4/2012 | Kusai | G11C 11/5685 257/4 |
| 2012/0256156 A1* | 10/2012 | Arita | G11C 13/0007 257/4 |
| 2013/0023085 A1 | 1/2013 | Pramanik et al. | |
| 2013/0328009 A1* | 12/2013 | Miyagawa | H01L 27/101 257/4 |
| 2014/0008603 A1* | 1/2014 | Takahashi | H01L 45/14 257/4 |
| 2014/0264236 A1 | 9/2014 | Kim et al. | |
| 2015/0295172 A1* | 10/2015 | Sung | H01L 45/1253 257/2 |
| 2016/0020388 A1* | 1/2016 | Wang | H01L 45/08 257/3 |
| 2017/0040532 A1* | 2/2017 | Tseng | H01L 45/122 |
| 2017/0141026 A1* | 5/2017 | Tu | H01L 27/0805 |

FOREIGN PATENT DOCUMENTS

| | | |
|---|---|---|
| CN | 101894853 A | 11/2010 |
| CN | 102157495 A | 8/2011 |
| CN | 102244196 A | 11/2011 |
| JP | 2005530924 A | 10/2005 |
| JP | 2007311542 A * | 11/2007 |
| JP | 5144840 B2 | 2/2013 |
| TW | 201535373 A | 9/2015 |

OTHER PUBLICATIONS

X. Jiang et al., "a-SiNx:H-based ultra-low power resistive random access memory with tunable Si dangling bond conduction paths," Scientific Reports, vol. 5, Article No. 15762, published Oct. 28, 2015.*

{Bistable or multistable switching devices, e.g. for resistance switching non-volatile memory}. Revision Aug. 2019. (Year: 2019).*

Taiwanese Office Action and Search Report for Taiwanese Patent Application No. 105140634 dated Sep. 25, 2017, 14 pages (including English translation).

Chinese Office Action and Search Report for Chinese Patent Application No. 201611124647.0 dated Sep. 5, 2018, 8 pages (including English translation).

Korean Office Action for Korean Patent Application No. 10-2016-0166890 dated Jun. 20, 2018, 17 pages (including English Translation).

Taiwanese Office Action and Search Report for Taiwanese Patent Application No. 105140634 dated Jun. 4, 2018, 9 pages (including English translation).

Second Office Action for Chinese Patent Application No. 201611124647.0 dated May 5, 2019, 4 pages long.

First Office Action for corresponding Korean Patent Application No. 10-2019-0074088 dated Aug. 21, 2019, 7 pages long Notice of Allowance for corresponding Chinese Patent Application No. 201611124647.0 dated Nov. 4, 2019, 4 pages long.

* cited by examiner

FORMATION OF BLOCKING LAYER BETWEEN
ACTIVE METAL AND INTERFACE LAYER

DEVICE AFTER HIGH-TEMP PROCESS

DEVICE AFTER PROGRAM PROCESS

DEVICE AFTER ERASE PROCESS

//+ # REGULATING INTERFACE LAYER FORMATION FOR TWO-TERMINAL MEMORY

CROSS-REFERENCE TO RELATED APPLICATION

This application is a U.S. Non-Provisional Patent Application that claims the benefit of priority to U.S. Provisional Patent Application No. 62/264,779, filed Dec. 8, 2015 and titled "REGULATING INTERFACE LAYER FORMATION FOR TWO-TERMINAL MEMORY," the entirety of which application is hereby incorporated herein by reference.

TECHNICAL FIELD

This disclosure generally relates to semiconductor fabrication, and more particularly to controlling resistive switching layer fabrication (e.g. growth or deposition) for two-terminal memory cells with the introduction of a nitrogen-containing gas.

BACKGROUND

Resistive-switching memory represents a recent innovation within the field of integrated circuit technology. While much of resistive-switching memory technology is in the development stage, various technological concepts for resistive-switching memory have been demonstrated by the inventors and are in one or more stages of verification to prove or disprove associated theories or techniques. The inventors believe that resistive-switching memory technology shows compelling evidence to hold substantial advantages over competing technologies in the semiconductor electronics industry.

The inventors believe that resistive-switching memory cells can be configured to have multiple states with distinct resistance values. For instance, for a single bit cell, the resistive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventors believe that arrays of many such memory cells, can provide many bits of digital memory storage.

The inventors have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventors have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventors desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Systems disclosed herein relate to controlling or regulating formation (e.g. growth/deposition) of an interface layer (e.g. resistive switching material layer) of a two-terminal memory cell with a nitrogen-containing (e.g. from $NH_3$) plasma. For example, a memory fabrication component can facilitate fabrication of a two-terminal memory cell with an active region comprising: a first electrode (e.g. metal, polysilicon), a contact or conductive material (e.g. conductive metal-containing or silicon bearing) layer, an interface layer (e.g. resistive switching material layer) situated atop the contact or conductive material layer (e.g. conductive metal-containing or silicon bearing layer), an active metal layer situated atop the interface layer, and a second electrode (e.g. metal, polysilicon). The memory fabrication component can include a formation component that can be configured to facilitate introduction of nitrogen-containing (e.g. $NH_3$) plasma in connection with a formation period characterized by formation (e.g. growth or deposition) of a resistive switching material (e.g. a resistive switching material layer) comprising the interface layer.

Methods disclosed herein relate to introducing a nitrogen-containing (e.g. $NH_3$) plasma in connection with fabricating a two-terminal memory device. Such can be accomplished by receiving a substrate including a first electrode, and a contact material (e.g. metal-containing or silicon bearing) layer associated with a two-terminal memory device at a growth chamber (e.g. plasma chamber). The method can include introducing a plasma comprising silicon (e.g. silane, $SiH_4$, etc.) and nitrogen (e.g. $NH_3$) into the formation (e.g. growth) chamber. The method can further include facilitating growth of an interface layer including silicon-bearing material, e.g., a silicon compound, a silicon nitride, or the like on the contact material (e.g. metal-containing, silicon bearing) layer. The resistive switching material comprising the interface layer is disposed between the contact material (e.g. metal-containing, silicon bearing) layer and an active metal layer.

In other embodiments, methods disclosed herein relate to introducing a nitrogen-containing (e.g. $NH_3$) plasma as well as a silicon-containing (e.g. $SiH_4$) plasma at a deposition chamber (e.g. plasma chamber). The method can include introducing a plasma comprising nitrogen (e.g. $NH_3$) into the formation (e.g. deposition) chamber. The method can further include facilitating deposition of an interface layer including a silicon-bearing material, a silicon compound, a silicon nitride, or the like) on a first electrode terminal. The resistive switching material comprising the interface layer is disposed between the first electrode/terminal layer and an active metal layer. In various embodiments, deposition may be via plasma-enhanced chemical vapor deposition (PECVD) at deposition temperatures ranging from approximately room temperature to less than about 400 C, or less than about 200 C.

In various embodiments, the silicon-bearing, interface layer may be a silicon nitride. In such embodiments, as nitrogen (reactive) is also present in the formation chamber from the $NH_3$ or other nitrogen-bearing plasma. In various embodiments, the resistive switching material comprising the interface layer is formed to be an amorphous silicon nitride. In various embodiments described herein the term silicon nitride may include one or more of the following stoichiometric or non-stoichiometric relationships: $Si_3N_4$ or $SiN_x$ (e.g. $Si_3N_{(4\pm x)}$ where $0<x<1$; $Si_3N_{(4-x)}$ where $0<x<1$; $Si_xN_y$ where $x\leq y\leq (x+1)$, e.g. $Si_3N_{3.5}$; $SiN_x$ where $1<x<4/3$; or the like). In various embodiments, the non-stoichiometric silicon nitride may be a sub-nitride (e.g. less nitrogen than stoichiometric silicon nitride). Additionally, in various embodiments, the silicon nitride includes a plurality of defect regions therein.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION INTRODUCTION

Figure 1:
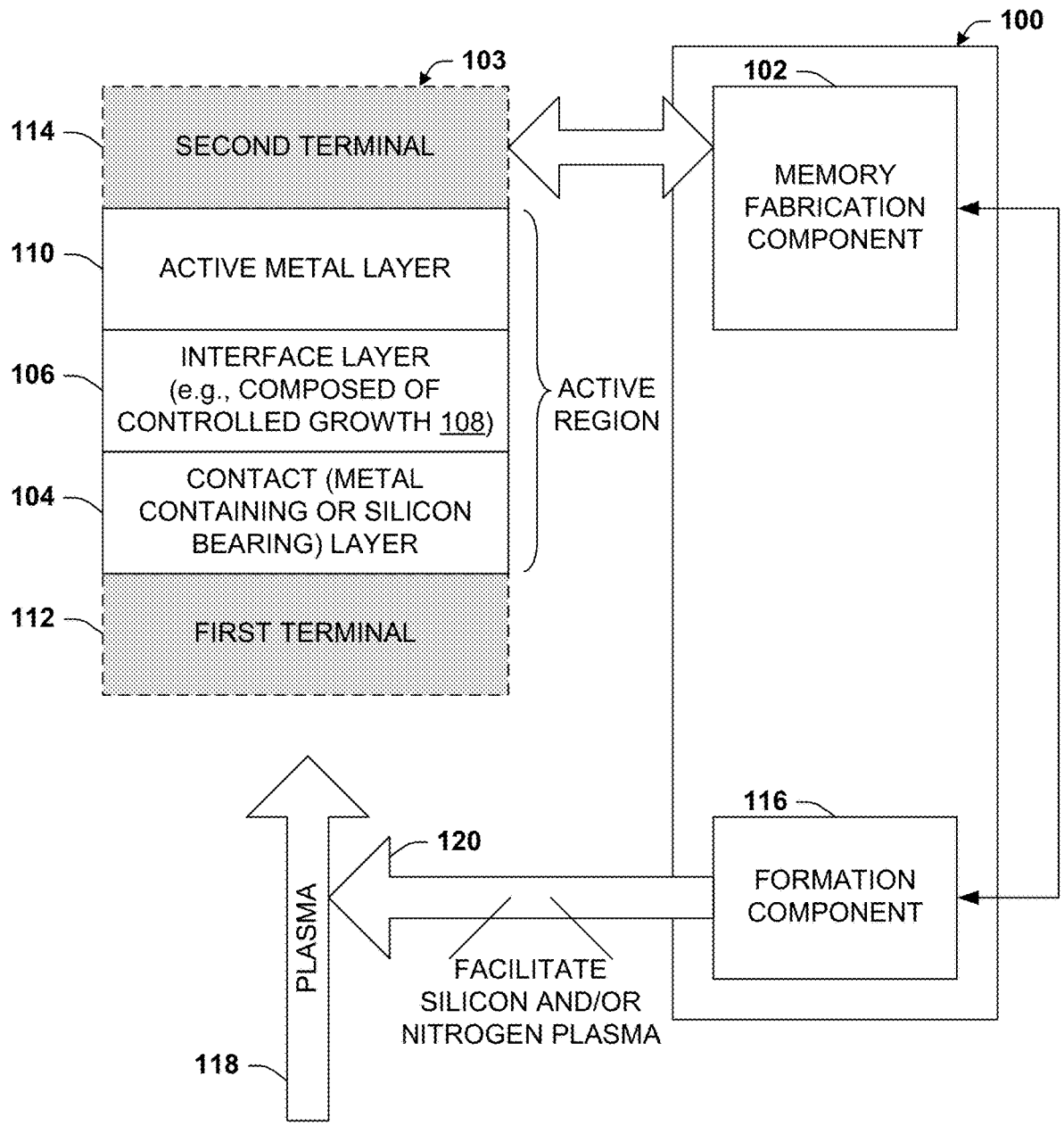
FIG. 1 illustrates a block diagram of an example system that can provide for regulating formation (e.g. growth or deposition) of an interface layer (e.g. silicon and nitrogen-containing material) in connection with fabrication of a two-terminal memory cell in accordance with certain embodiments of this disclosure.

In two-terminal memory cells, particularly resistive-switching memory cells, the portions of the cell between the two terminals are denoted herein as the active region of the cell. In some embodiments, this active region can include an interface layer between a contact material (e.g. metal-containing barrier or silicon bearing) layer and an active metal layer, all of which are further detailed herein, but see also U.S. application Ser. No. 14/946,367 filed Nov. 19, 2015 and U.S. Pat. No. 9,209,396 issued Dec. 8, 2015, each of which are hereby incorporated by reference herein in their respective entireties and for all purposes. The interface layer in particular plays a significant role in the switching properties of a two-terminal memory cell (e.g., a resistive-switching memory cell such as a resistive random access memory (RRAM) cell). The interface layer can be formed from deposition of silicon and nitrogen compounds prior to the deposition of the active metal layer. Additionally or alternatively, the interface layer can be grown or deposited with process control techniques that enable precise device specifications.

In some embodiments, the interface layer formed as a byproduct, may primarily include silicon and nitrogen. In some examples described herein, hydrogen and nitrogen from a nitrogen-containing gas (e.g. $NH_3$) may be incorporated into the interface layer. In some embodiments, the interface layer is a byproduct of a post etch ashing process, a post etch cleaning process, a pre-deposition cleaning process, or the like, depending on the integration scheme which is further detailed with reference to FIGS. 4A and 4B.

Integrating or using these byproduct layers of the active region to form a high quality memory cell sometimes presents a number of challenges. For example, it can be difficult to control byproduct interface layer thickness across adjacent devices, across an entire wafer, and from wafer-to-wafer. Existing process controllability sometimes does not meet requirements typical of semiconductor manufacturing processes. Further, controlling the composition of the byproduct interface layer in a uniform manner can sometimes be difficult. In the case of certain two-terminal memory cells, a typical desired thickness for the byproduct interface layer ranges from 1 nanometer (nm) to 12 nm. In light of the above, the inventors believe that the interface layers should be specifically engineered in some cases.

One proposed solution is to deliberately remove the byproduct interface layers via a cleaning process. After cleaning, oxides, or the like that may have previously existed on a contact material (e.g. metal-containing or silicon bearing) layer are reduced or removed. Subsequently an engineered interface layer can be grown from a new, controlled growth (e.g. PECVD) process on top of the contact material (e.g. metal containing silicon bearing) layer, prior to deposition of the active metal layer. In other embodiments, the engineered interface layer may be deposited. In some embodiments, deposited engineered interface layers may sometimes be associated with additional challenges.

In some embodiments, the challenges include that the engineered interface layer should be only a few nanometers thick, which is sometimes too thin for conventional deposition techniques. In various embodiments depositing an interface layer on the order of a few nanometers in thickness would generally require an atomic layer deposition (ALD) process to attain adequate manufacturability. In some embodiments, ALD processes require expensive equipment and are inherently higher temperature processes, above the temperature limit for building cells atop a complementary metal oxide semiconductor (CMOS) architecture. Therefore, ALD-fabricated cells are generally more expensive to manufacture and may have lower range of useful applications. Furthermore, ALD-fabricated cells can be associated with denser stoichiometric oxides that resist filament formation (described below), therefore requiring higher voltages when programming or otherwise changing the state of the cell. In some cases ALD-fabricated cells are also associated with native oxides (e.g. silicon oxide) being formed upon certain types of contact materials (e.g. silicon bearing) layers prior to the deposition process.

Fabricating a two-terminal memory cell by way of deposition of the engineered interface layer can be beneficial for a number of reasons. For example, depositing an engineered/controlled layer on an exposed surface of the contact material (e.g. metal containing silicon bearing) layer (e.g., prior to active metal deposition) can be accomplished in a controlled fashion, employing existing semiconductor processing equipment that is common and inexpensive. Additionally, the vapor deposition process can be readily integrated into existing manufacturing processes. Further, the deposition process can be accomplished in a relatively low-temperature environment (e.g., ranging from about room temperature to about 300 degrees Celsius or below) that is compatible with CMOS substrates. In addition, the deposition process can provide a simple silicon nitride within the desired thickness ranges and with the desired attributes.

One manner of facilitating the interface material (e.g., silicon nitride) deposition or formation is to employ a nitrogen (e.g., $NH_3$) plasma and a silicon (e.g., $SiH_4$) plasma in connection with a process for depositing the interface layer of a two-terminal memory cell. The controlled use of nitrogen (e.g., $NH_3$) plasma can extend the associated deposition (e.g., nitrogenation) period. Thus, in some embodiments, the interface layer deposited in response to introduction of a silicon (e.g., $SiH_4$) and a nitrogen (e.g., $NH_3$) plasmas can be controlled. Furthermore, use of a silicon (e.g., $SiH_4$) plasma and a nitrogen-containing (e.g., $NH_3$) plasma can maintain the thermal budget imposed by CMOS substrates, so that memory cells produced accordingly can function in connection with CMOS architectures.

In some embodiments, thermal processes employed for CMOS fabrication can impose constraints on two-terminal memory devices formed in a common wafer with CMOS devices or otherwise as part of a structure exposed to CMOS device processing. For instance, higher temperature processes (e.g., 400 C-450° C.) employed for CMOS devices can instigate significant diffusion of active metals into surrounding materials. Diffusion of such metals in nanoscale processes can increase exponentially with increasing temperatures. Further, thermal diffusion is generally not localized; active metal diffusion in response to high temperatures can result in widespread contamination of nearby materials that are porous to such metals. In the context of a two-terminal memory device, an active metal is often employed as a source of conductive ions for an interface layer, which is selected to be at least partially permeable to the active metal. Thus, active metal contamination that is detrimental to memory device operation can occur within interface layers or other insulating layers of a two-terminal device in response to the higher temperatures of CMOS device processing. This contamination can be exacerbated for thin film materials as well as higher technology nodes that have relatively small physical dimensions (e.g., below 55 nm, and particularly below 28 nm). Smaller scale materials in memory technology can provide many desired advantages, including improved memory density, lower operating voltages, and lower per-cell power consumption, among others. But effects of smaller scale operations, such as active metal contamination, create challenges for maintaining low fabrication costs and high device reliability.

Some disclosed embodiments provide for mitigation of active metal contamination by providing a blocking layer having low diffusivity to an adjacent active metal. The blocking layer can be positioned between the active metal and the interface layer, in some embodiments, or between the active metal and other insulating layers in additional embodiments. The blocking layer can be saturated or partially saturated with active metal ions during higher temperature fabrication processes, and mitigate active metal diffusion into the interface layer or other insulating layers. In at least one embodiment, the saturation of the blocking layer with the active metal ions can facilitate the blocking layer being a source of conductive ions for formation of a conductive filament through the interface layer, in conjunction with programming or erasing the two-terminal device.

Example of Regulating Interface Layer Growth with a Nitrogen-Containing Gas

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, system 100 is depicted. System 100 can provide for regulating growth of a resistive switching layer (e.g. a silicon and nitrogen-containing plasma in connection with fabrication of a two-terminal memory cell. System 100 can include a memory that stores computer executable components and a processor that executes computer executable components stored in the memory, examples of which can be found with reference to FIG. 8. It is to be appreciated that the computer 802 can be used in connection with implementing one or more of the systems or components shown and described in connection with FIG. 1 or other figures disclosed herein. As depicted, system 100 can include a memory fabrication component 102 and a formation component 116.

Memory fabrication component 102 can be configured to fabricate or facilitate fabrication of two-terminal memory cell/device 103 upon a CMOS substrate. In various embodiments, the CMOS substrate includes one or more transistors. The transistors may be drivers to operate the two-terminal memory device, may be processing logic (e.g. field programmable gate array (FPGA), central processing unit (CPU), or the like), and the like. The MOS devices may be coupled to one or both electrodes of the device. In various embodiments, a first and second electrode can be coupled to a first terminal 112 and a second terminal 114 of a two-terminal memory cell 103. An active region is illustrated disposed between first terminal 112 and second terminal 114. In one embodiment, the active region can be constructed comprising a metal bearing or silicon bearing layer (a contact layer) 104, an interface layer 106 (which can be composed of or comprise one or more controlled silicon and nitrogen compound(s) 108), and active metal layer 110. In some embodiments, two-terminal memory cell 103 can be a resistive-switching memory cell, an example of which is provided with reference to FIG. 2.

Figure 2:
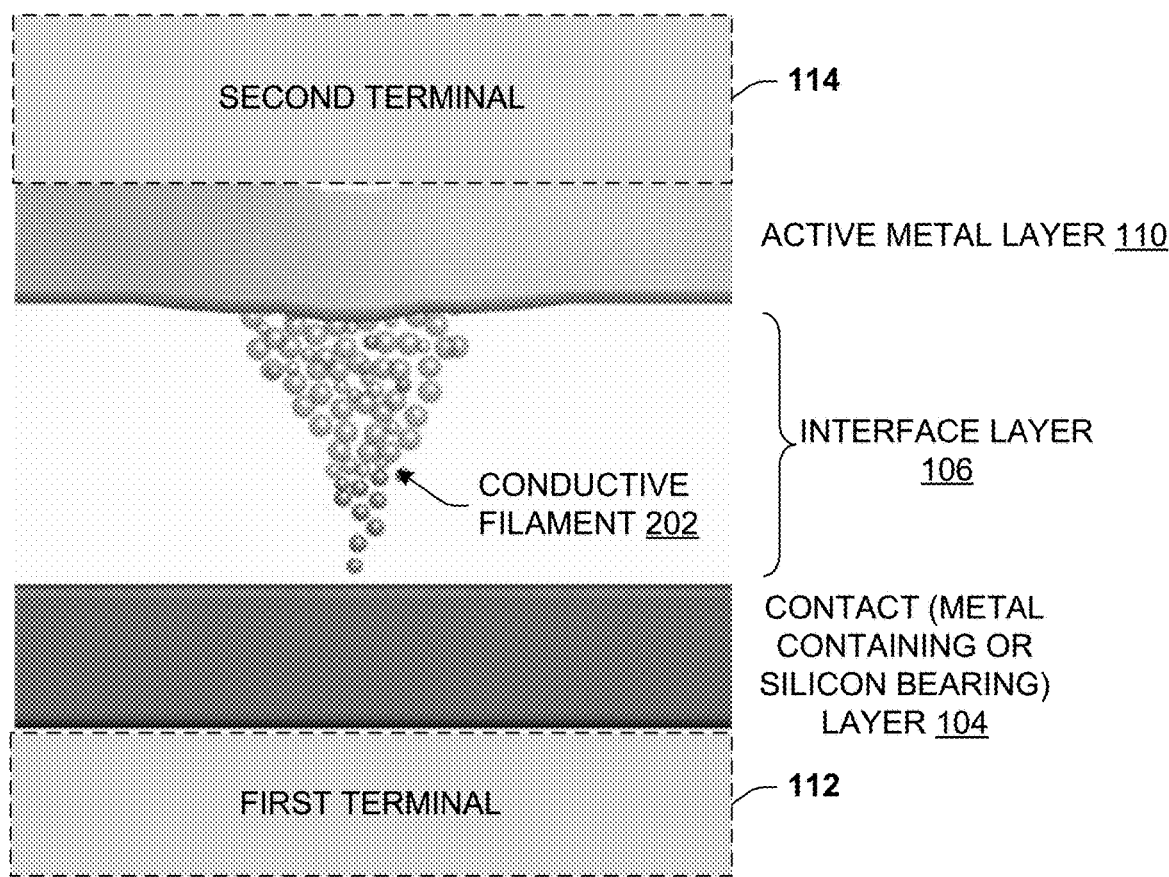
FIG. 2 depicts an example illustration of a cross-section of an example active region of an example two-terminal memory cell in accordance with certain embodiments of this disclosure.

While still referring to FIG. 1, but turning also now to FIG. 2, illustration 200 is provided. Illustration 200 depicts a cross-section of an example active region of an example two-terminal memory cell 103. In order to provide additional detail or context, it is understood that this disclosure relates to two-terminal memory cells, particularly resistive switching two-terminal memory cells, in various embodiments. Resistive switching two-terminal memory cells (also referred to as resistive switching memory cell(s) or device (s)), as utilized herein, comprise circuit components having two electrical contacts (also referred to herein as electrodes or terminals) with an active region between the two conductive contacts. An example of the active region of the two-terminal memory device is provided by illustration 200. This active region can exhibit a plurality of stable or semi-stable resistive states, each resistive state having different electrical resistance. Moreover, respective states of the plurality of states can be formed or activated in response to a respective voltage difference applied at the two conductive contacts.

One example of a resistive switching two-terminal memory device, though not exhaustive, can include a resistive random access memory (RRAM) cell or device. Embodiments of the subject disclosure can provide a filamentary-based memory cell 103 including a first terminal 112 and second terminal 114, as depicted. For example, in a 'programmed' or 'on' state, conductive filament 202 can form when ions from active metal layer 110 are formed and permeate interface layer 106, generally in response to a program voltage applied across the terminals 112, 114, which is further detailed infra. One example of a filamentary-based memory cell can comprise: a contact layer (e.g. a p-type or n-type silicon (Si) bearing layer, such as a p-type or n-type polysilicon, p-type or n-type silicon germanium (SiGe), and so forth), a metal-containing layer, a metal nitride (e.g. tantalum nitride, titanium nitride, or the like), the interface layer 106 (also referred to as a resistive switching layer (RSL) or a resistive switching material layer (RSML)) and an active metal layer for providing filament forming ions to the interface layer 106.

In some embodiments, the contact layer (e.g. p-type or n-type Si bearing layer) can include a p-type or n-type polysilicon, p-type or n-type SiGe, metal nitride, or the like. The interface layer 106 can comprise, e.g., an undoped amorphous Si layer, a semiconductor layer having intrinsic characteristics, an undoped silicon-containing material, a silicon nitride (e.g. stoichiometric, non-stoichiometric, and so forth.) In various embodiments, interface layer 106 is typically undoped and amorphous. A plurality of defect regions result from the amorphous nature of the material in interface layer 106.

Examples of the active metal layer 110 can include, among others: silver (Ag), copper (Cu), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations, alloys, of the foregoing (e.g. a metal nitride) can be employed for the active metal layer 110 in some aspects of the subject disclosure. For example, the active metal can include AlN, TiN, Cu sub-oxide ($CuO_x$, where $0<x<2$), or any other suitable metal oxide or metal nitride. As an illustrative example, taking silver or aluminum material (or a silver or aluminum nitride material) as the conductive material and a non-stoichiometric amorphous silicon nitride, silicon oxide, etc., as the switching material, upon applying a positive voltage to the first electrode, a plurality of silver (or aluminum) particles (ions) are formed in the active metal layer 110 and migrate into defect regions of the switching material. Upon removal of the positive voltage, the plurality of silver (or aluminum) particles become neutral particles and some become trapped in the defect regions of the switching material in the form of conductive filament 202. The plurality of silver (or aluminum) particles (neutral) can include a filament structure having a length. The length of the silver (or aluminum) filament structure can change upon applying a suitable voltage, e.g., extending through all or most of a thickness of the switching material and thus changing the electrical resistance of the non-switching material at least between the terminals 112, 114. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

To program one or more disclosed embodiments, a suitable program voltage can be applied across the memory cell causing a conductive filament to form through a resistive portion of the memory cell as mentioned above. This can further cause the memory cell to switch from a relatively high resistive state, to a relatively low resistive state. An erase process can be implemented to reverse the foregoing, at least in part (e.g., by breaking electrical continuity of the conductive filament between terminals 112, 114), causing the memory cell to return to the high resistive state from the low resistive state. This change of state, in the context of memory, can be associated with respective states of a binary bit. Accordingly, multiple such memory cells 103 can be programmed or erased to represent respective zeroes or ones of binary information, and by retaining those states over time in effect storing binary information. For various reasons, in some embodiments, resistive switching memory cells are generally quick to program and responsive, changing state readily in response to a program voltage. This quick switching of state is a significant advantage of various disclosed memory cells over other memory cell technologies.

As applied to illustration 200, when a suitable program voltage (e.g., a positive voltage) is applied across the terminals of two-terminal memory cell 103, ions form from active metal layer 110 and move into the adjacent interface layer 106, which is at least partially permeable to the ions that collectively form conductive filament 202. Conductive filament 202 can span the entire thickness or a portion of the interface layer 106, facilitating electrical conductivity through the interface layer 106. When the program voltage is applied and conductive filament 202 forms, the memory cell is said to be in the on-state, which is a low-resistance state. In response to a suitable erase voltage (e.g., a negative voltage), conductive filament 202 can at least in part deform or retract towards active metal layer 110, breaking the electrical conductive path. Such is a high-resistance state, associated with an off-state. The state can be determined by measuring current through cell 103 when a suitable read voltage is applied. The read voltage generally is not sufficient (or the proper polarity) to either form or de-form conductive filament 202, so current readings associated with the read current can be used to determine if the cell is in the high-resistance state (e.g., off) or the low-resistance state (e.g., on). In this example, two-terminal memory cell 103 is in the on state, with conductive filament spanning interface layer 106.

It should be appreciated that a variety of resistive switching memory cell technologies exist, having different physical properties. For instance, some embodiments of the subject disclosure can have different discrete programmable resistances, different associated program/erase voltages, as well as other differentiating characteristics. For instance, in a unipolar embodiment, once a memory cell is initially programmed, the memory cell can be later programmed in response to a first positive voltage (e.g., three volts) and erased in response to a second positive voltage (e.g., between four and five volts). Other embodiments can alternatively exhibit bipolar characteristics, and become programmed in response to a positive voltage and erased in response to a negative voltage. Where an embodiment does not specify a unipolar or bipolar characteristic, or does not indicate suitable program/erase voltages, it is intended that such aspects and embodiments incorporate any suitable memory cell technology and can be operated by program/erase voltages appropriate to that memory cell technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Many of these devices include materials that are incompatible with many common CMOS fabrication processes. Accordingly, expensive fabrication overhead costs (e.g., retooling, redesign, retesting, etc.) are projected in association with producing these devices. In addition, these devices can exhibit relatively slow switching speeds, small on/off resistance ratios (e.g., leading to small sensing margin) or poor thermal stability, as well as other problems.

Compatibility with CMOS fabrication processes is believed by the inventors of the present disclosure to be a significant factor related to fabrication cost reduction for new types of electronic memory. Some proposed resistive-switching memory cells are constrained by CMOS fabrication constraints, including process temperature(s), memory cell material(s), wiring or electrode material(s), memory cell material(s), dopant material(s), and so forth. For example, to avoid overhead costs in retooling CMOS fabrication equipment, embodiments of the resistive-switching memory can often involve memory elements built on a Si wafer. Interconnecting the Si wafer and the memory elements can involve several layers of interconnects, often involving conductive materials such as Aluminum (Al) or Copper (Cu) metals, alloys, nitrides, or the like. Due to relatively low softening temperatures of these metals, fabrication of the memory elements can be constrained to 450 degrees Celsius or lower, 300 degrees Celsius or lower, or the like (e.g., for Al interconnect technology).

Still referring to FIG. 1, and with the foregoing in mind, it is understood that temperatures employed for CMOS-related fabrication can limit the materials that might be employed or the fabrication processes used. As one example, atomic layer deposition (ALD) can be employed to deposit a thin film between a contact (e.g. metal bearing or silicon bearing) layer 104 and active metal layer 110. However, the ADL process is quite expensive in terms of equipment and is a very high-temperature process, exceeding the thermal budget of CMOS-related fabrication. Accordingly, the inventors of the present application believe that a low temperature process for forming interface layer 106 constitutes an improvement in two-terminal and/or resistive-switching memory cell technology. Such improvements can include increasing manufacturability, improved density or stoichiometry parameters, mitigating or avoiding costs of retooling and redesigning CMOS-related fabrication equipment, compatibility with existing patterning and etching processes, and others.

Accordingly, memory fabrication component 102 or system 100 can facilitate depositing controlled material 108 (e.g. non-stoichiometric silicon nitride) atop a contact (e.g. barrier metal bearing or silicon bearing) layer 104 in a manner that provides numerous advantages, such as those noted above. In particular, controlled material 108 (e.g. amorphous non-stoichiometric silicon nitride) deposited on contact (e.g. metal bearing or silicon bearing) layer 104 by introduction of a plasma 118 containing one or more components such as a silicon plasma (e.g. from silane, $SiH_4$, or the like; see 120 of FIG. 3, infra) or a nitrogen plasma (e.g. from $NH_3$ plasma; see 312 of FIG. 3, infra) or a suitable combination of the foregoing. System 100 can include formation component 116 that can, inter alia, monitor, regulate, and/or control parameters associated with plasma 118, e.g. power, chamber temperature, pressure, and the like. For example, formation component 116 can be configured to facilitate introduction, with reference to FIG. 3, of silane plasma denoted by reference numeral 120 and NH$_3$ plasma denoted by reference numeral 312. The introduction of plasma 118 can occur in connection with a growth (e.g. a nitrogenation) period characterized by growth of controlled material (e.g., non-stoichiometric silicon nitride) 108 comprising interface layer 106.

Figure 3:
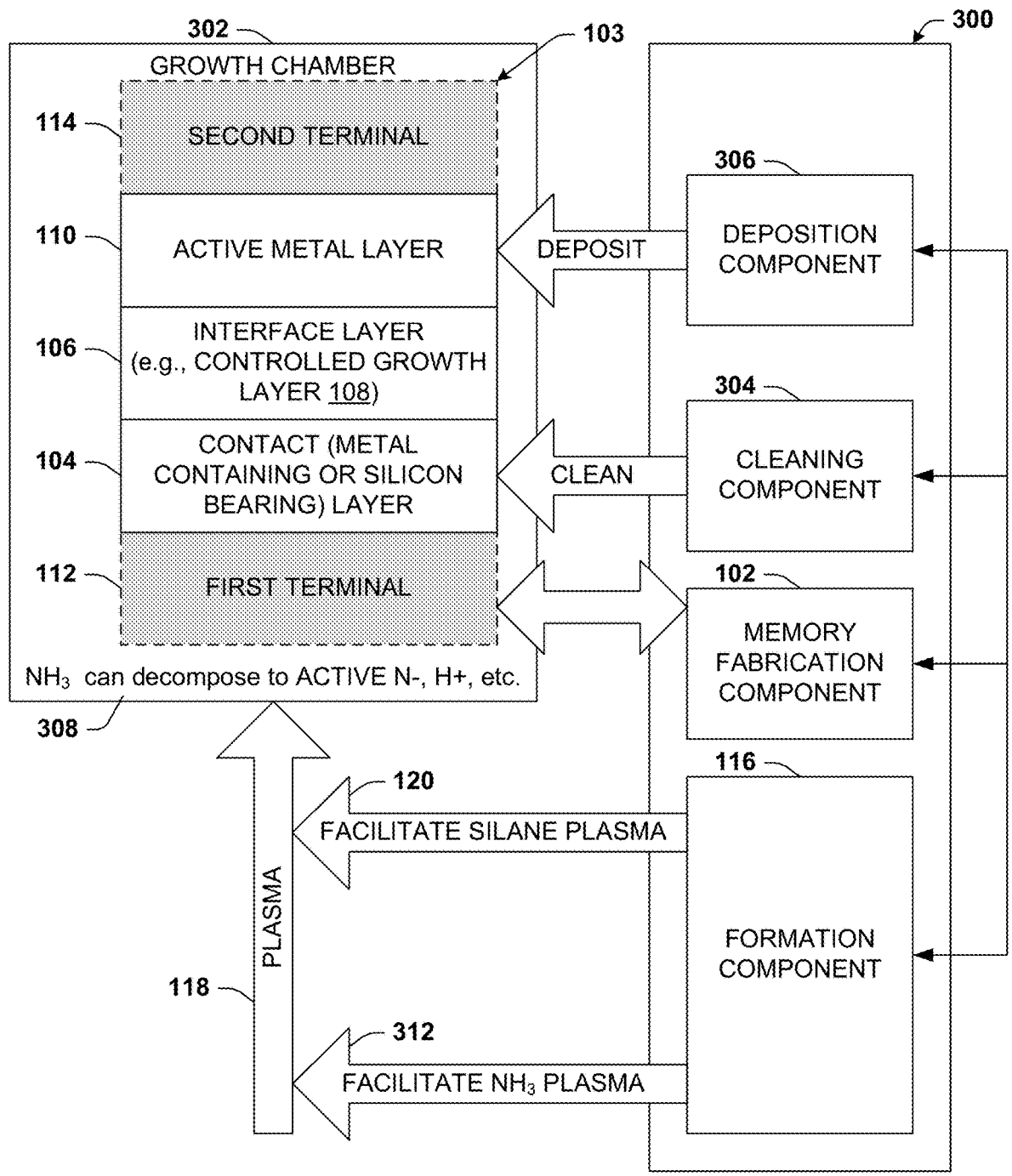
FIG. 3 illustrates a block diagram of an example system that can provide for additional features or aspects in connection with regulating interface layer formation (e.g. growth or deposition) with a silicon-containing and a nitrogen-containing (e.g., $NH_3$) plasma in accordance with certain embodiments of this disclosure.

Referring now to FIG. 3, system 300 according to various embodiments is provided. System 300 can provide for additional features or aspects in connection with regulating interface layer growth with silane and NH$_3$ plasma. For example, FIG. 3 illustrates once more example two-terminal memory 103 post-fabrication. However, during fabrication, and in particular during fabrication of the active region facilitated by memory fabrication component 102, contact material (e.g. metal containing or silicon bearing) layer 104 can be introduced to growth chamber 302, where plasma 118 can be introduced.

As discussed in connection with FIG. 1, and similarly here, formation component 116 can facilitate introduction of silane plasma 120, NH$_3$ plasma (denoted by reference numeral 312) or other suitable materials in a plasma state. In certain embodiments, a desired thickness of interface layer can be between about 1 nanometer to about 12 nanometers.

Therefore, considering the case in which it is desired to have a particular controlled material (e.g. silicon nitride) 106/108 reach a thickness of a few nanometers, the growth and associated formation period required to grow controlled material (e.g. silicon nitride) 108 to the desired thickness might be, e.g., 15 seconds. The time associated with the formation (e.g. nitrogenation) period can be significant in terms of maintaining a uniform interface layer 106 across adjacent memory cells, across an entire wafer, and even wafer-to-wafer, as well as other improvements associated with manufacturability.

Additional advantages exist. For example, in one example the interface layer 106 includes a non-stoichiometric silicon nitrogen compound, e.g. Si$_3$N$_4$ or SiN$_x$ (e.g. Si$_3$N$_{(4\pm x)}$ where $0<x<1$; Si$_3$N$_{(4-x)}$ where $0<x<1$; Si$_x$N$_y$ where $x \le y \le (x+1)$, e.g. Si$_3$N$_{3.5}$; SiN$_x$ where $1<x<4/3$; or the like) of just a few nanometers. The controlled material 108 may exhibit further desirable characteristics in terms of density or stoichiometric features. Specifically, controlled growth 108 is generally a resistive switching material that is less dense (less than stoichiometric amount of Nitrogen) and can therefore effect switching operations with lower voltages. Thus, even though controlled material 108 (e.g., grown in connection with silane and NH$_3$ plasma) can be the same thickness as a silicon nitride grown with introduction of pure NH$_3$ plasma on a silicon bearing contact, however, the controlled material 108 can be less dense, enhancing operational characteristics such as reduced power consumption, lower heat and so on.

Still referring to FIG. 3, in some embodiments, system 300 (or system 100) can further include cleaning component 304 that can be configured to facilitate cleaning of contact (e.g. silicon bearing) layer 104 prior to formation of interface layer 106. For example, native oxides due to prior and/or uncontrolled exposure can form on contact (e.g. silicon bearing) layer 104. These or any other oxides or contaminants can be cleaned during the cleaning process. Thereafter, the nitrogenation period can begin and controlled material 108 can be grown or deposited fresh.

In some embodiments, system 300 (or system 100) can further include deposition component 306. Deposition component 306 can be configured to facilitate deposition of active metal layer 110, upon which second terminal 114 can thereafter be positioned. Once active metal layer 110 is deposited, interface layer 106 is no longer exposed to plasma 118 or other reactive materials, so deposition of active metal layer 110 can constitute the end of the growth period, terminating further silicon nitride growth so interface layer 106 will typically remain at the existing thickness.

In some embodiments, an interface material may be disposed between active metal layer 110 and interface layer 106. The interface material may be a titanium, titanium oxide, tungsten, or other barrier material. In various embodiments, the interface material may serve as a barrier (e.g. tunneling layer) between ions of the active metal layer and interface layer 106.

Figure 4A:
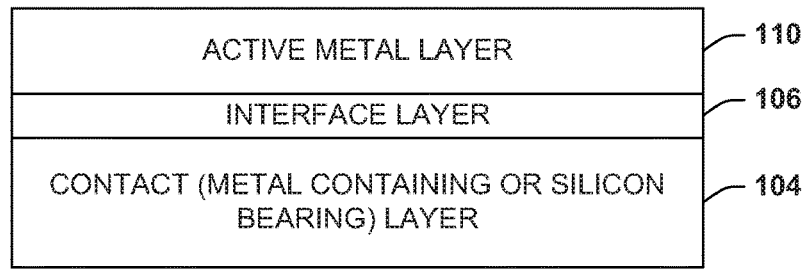
FIG. 4A depicts an example formation of the interface layer in connection with a deposit metal/etch scheme in accordance with certain embodiments of this disclosure.
Figure 4B:
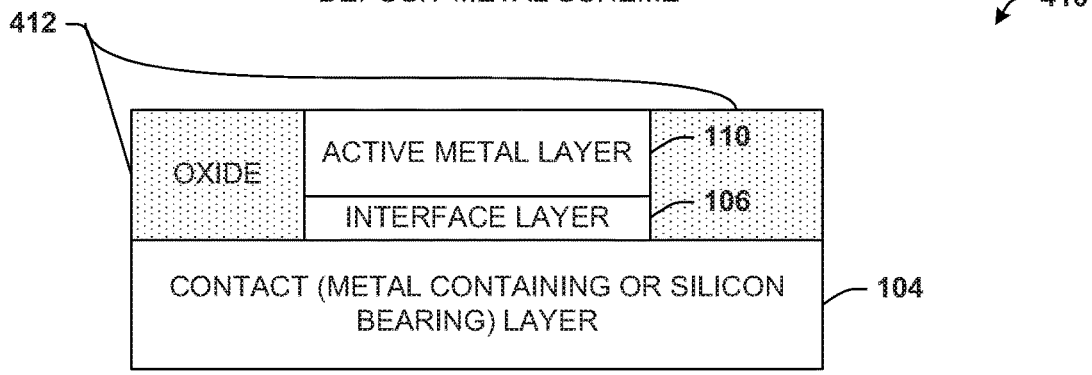
FIG. 4B depicts an example formation of the interface layer in connection with an etch/deposit metal scheme in accordance with certain embodiments of this disclosure.
Figure 4C:
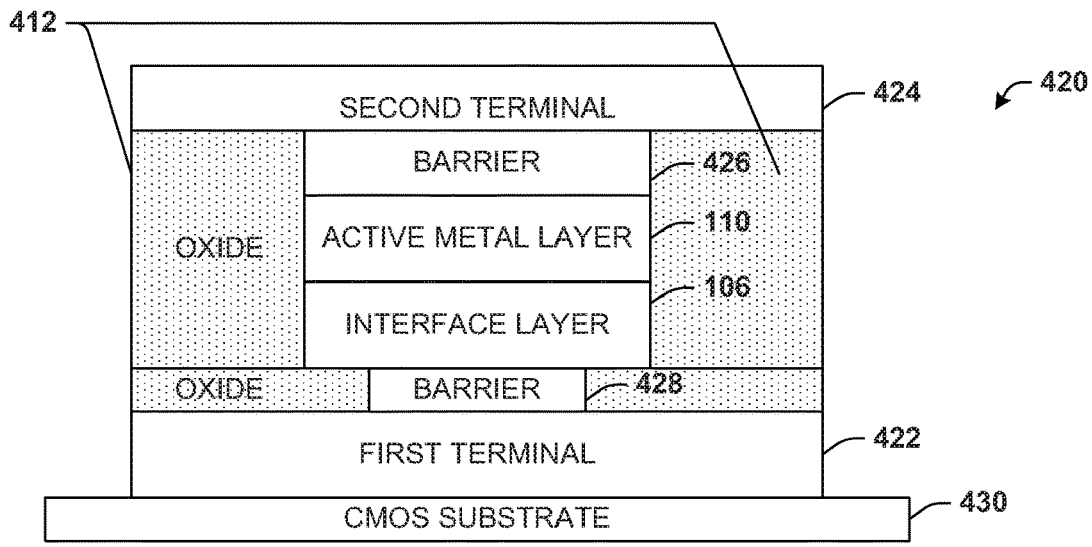
FIG. 4C depicts an example formation of the interface layer in connection with a deposit/etch scheme in accordance with certain embodiments of this disclosure.

FIGS. 4A-4C relate to fabrication techniques for various embodiments of the present disclosure. Turning now to FIG. 4A, example 400 is provided. Example 400 relates to formation of interface layer 106 in connection with a deposit metal/etch scheme. In contrast, example 410 of FIG. 4B relates to formation of interface layer 106 in connection with an etch/deposit metal scheme. In the latter example (e.g., example 410), oxide 412 has been etched to produce a central aperture in which interface layer 106 can be grown and active metal layer 110 deposited. In some embodiments a planarization step may be performed to obtain the structure illustrated in example 410. In FIG. 4C, example 420 relates to formation of interface layer 106 in connection with a deposit/etch scheme. In this example, a first terminal 422 and a second terminal 424 are shown, where first terminal 422 is disposed upon a CMOS substrate 430. As described in the above-incorporated patent applications, a first terminal 422 may be formed of a copper or aluminum material (metal or alloy). Next an oxide layer is deposited and an opening is formed wherein an adhesion or barrier layer 428 is deposited. In some embodiments, barrier layer 428 (e.g. titanium, titanium nitride, tungsten nitride, titanium tungsten, etc.) may be considered as part of first terminal 422 or as a contact material layer. Typically after a planarization step, an interface layer 106 (e.g. non-stoichiometric non-stochastic silicon nitride material discussed above), active metal layer 110 (e.g. silver or aluminum metal or alloy discussed above), and a barrier material 426 (e.g. titanium, titanium nitride, tantalum nitride, tungsten, titanium tungsten, etc.) may be deposited. These three material layers may be etched to form a pillar structure, and an oxide 412 can be deposited. Following a planarization process, a top surface of barrier material 426 is exposed. In various embodiments, second terminal 424 may be formed in contact with the top surface of barrier material 426. In some embodiments, second terminal 424 may include an additional barrier material (e.g. tantalum nitride, etc.) and a metal-containing layer (e.g. aluminum or copper metal or alloy).

Figure 5A:
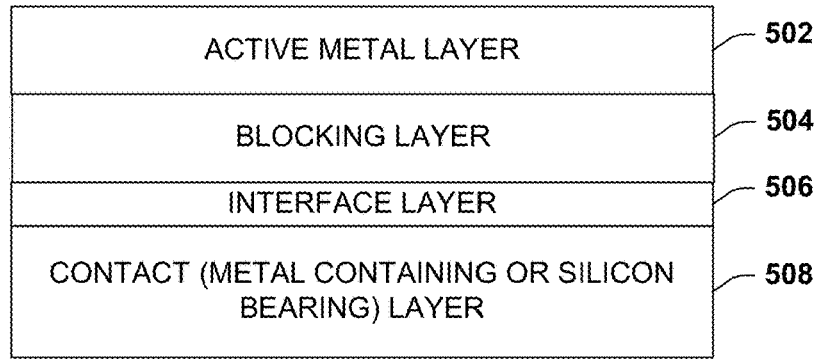
FIG. 5A depicts an example memory cell facilitating mitigated diffusion of active metal material in response to higher temperature processes, in an embodiment.
Figure 5B:
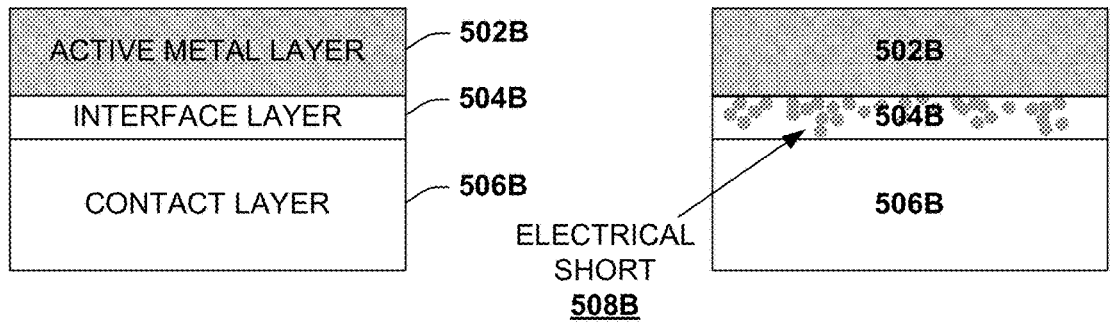
FIGS. 5B and 5C illustrate example active metal diffusion in response to prolonged high temperature processes for different disclosed memory cells.
Figure 5C:
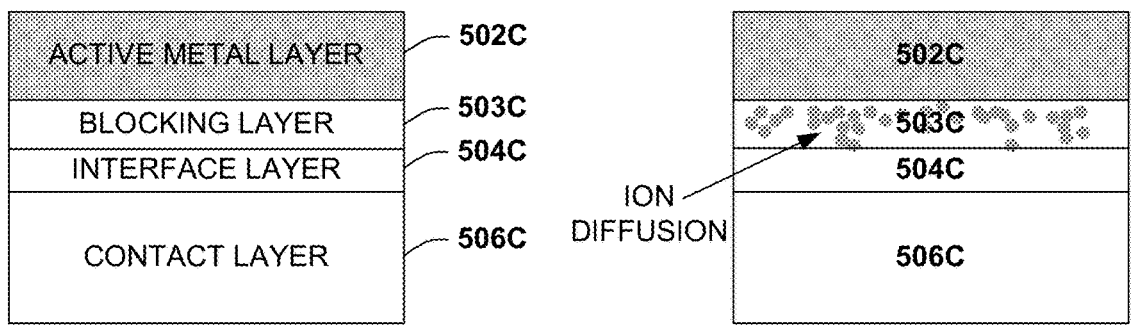

FIGS. 5A-5C illustrate example memory cells according to one or more additional embodiments of the present disclosure. At FIG. 5A, there is depicted a memory cell 500 configured to mitigate thermal diffusion of active metal during higher temperature processes associated with fabricating a memory chip (e.g., greater than 400 Celsius). Memory cell 500 can therefore yield greater fabrication yield, lower costs of fabrication, and greater operational reliability of memory cell 500. It should be understood that embodiments of memory cell 500 can be employed for other disclosed memory devices, and vice versa, where suitable.

Memory cell 500 can comprise a contact layer 508. In various embodiments, contact layer 508 can comprise a conductive material. Examples of such conductive material can include a metal containing material, or a conductive silicon (e.g., doped silicon) material. In some embodiments, the conductive material is selected from a group consisting of: titanium containing material, titanium nitride, tungsten containing material, and titanium tungsten. In at least one embodiment, contact layer 508 can be substantially similar to contact layer 104 described herein, though is not limited to this embodiment(s). An interface layer 506 is provided overlying contact layer 508. Interface layer 506 can comprise a resistive switching material in various embodiments. One example includes a silicon containing material, such as silicon, silicon nitride, silicon oxide, or a material containing a suitable percentage of the foregoing. Further examples include a non-stoichiometric material at least in part permeable to ions of an active metal layer 502 of memory cell 500 (e.g., non-stoichiometric silicon containing material, non-stoichiometric silicon nitride containing material, non-stoichiometric silicon oxide containing material, and so forth). Further examples include an amorphous material, an amorphous silicon nitride material, an amorphous silicon oxide material, or the like, or a suitable amorphous form of any of the foregoing (e.g., a non-stoichiometric amorphous silicon nitride material, etc.).

In addition to the foregoing, memory cell 500 can comprise a blocking layer 504 overlying interface layer 506. In some embodiments, blocking layer 504 can be a high-k dielectric material. In various embodiments, blocking layer 504 can be an oxide material, and in at least some embodiments blocking layer 504 can be a nitride material (e.g., a high-k nitride material). In one or more example embodiments, blocking layer 504 can comprise a material selected from a group consisting of: $SiO_2$, $Al_2O_3$, $HfO_2$, $ZrO_2$, $Ta_2O_5$, TaO, TiO, $WO_2$, $WO_3$, HfSiO, HfAlO, or a suitable combination of the foregoing.

Memory cell 500 can additionally comprise an active metal layer 502. Active metal layer 502 can comprise any suitable metal material, or a suitable metal compound, described herein or known in the art. In various embodiments, the active metal layer can comprise a metal, metal compound or metal alloy, wherein the metal is selected from a group consisting of: silver (Ag), gold (Au), titanium (Ti), copper (Cu), nickel (Ni), aluminum (Al), chromium (Cr), tantalum (Ta), iron (Fe), manganese (Mn), tungsten (W), vanadium (V), cobalt (Co), platinum (Pt) and palladium (Pd). In at least one embodiment, active metal layer 502 can comprise Al, Ti, Ag, Cu, a nitride of one or more of the foregoing, or an oxide of one or more of the foregoing. The metal material or metal compound material can be selected to have low diffusivity to blocking layer 504. In some embodiments, active metal layer 502 can comprise Al, AlN, Ti, TiN, Cu, or a non-stoichiometric Cu sub-oxide (e.g., $CuO_x$ where $0<x<2$); blocking layer 504 can comprise $HfO_2$ or TiO; interface layer 506 can comprise a SiN, and contact material 508 can comprise a suitable electrical conductor on which interface layer 506 can be formed. In at least one embodiment, a first material selected for blocking layer 504 can have a first diffusivity to ions of active metal layer 502, and a second material selected for interface layer 506 can have a second diffusivity to ions of active metal layer 502, and a ratio of the first diffusivity to the second diffusivity can be about 1 to about 30 (1:30).

FIG. 5B depicts a block diagram of a sample memory cell 510 according to further embodiments. Memory cell 510 can comprise an active metal layer 502B, an interface layer 504B and an electrically conductive contact layer 506B. Interface layer 504B is selected to have relatively high permeability to ions of active metal layer 502B. In response to a high temperature bake of, for example, 400-450 degrees Celsius, ions of active metal layer 502B can diffuse throughout interface layer 504B. In some aspects, an electrical short 508B can form within interface layer 504B. The electrical short 508B, when present, can undermine efficacy of memory cell 510.

FIG. 5C illustrates a block diagram of a sample memory cell 520 according to additional embodiments. Memory cell 520 includes a blocking layer 503C, positioned between an active metal layer 502C and an interface layer 504C, overlying a contact layer 506C. In response to the high temperature bake (e.g., 400-450 degrees Celsius), ions of active metal layer 502C can diffuse within blocking layer 503C. The ions do not significantly diffuse within interface layer 504C, however. Following the high temperature bake, blocking layer 503C with the ion diffusion can be a source of the ions of active metal layer 502C for formation of a conductive filament within interface layer 504C, in response to a forming voltage, or a program voltage, for instance.

Figure 6A:
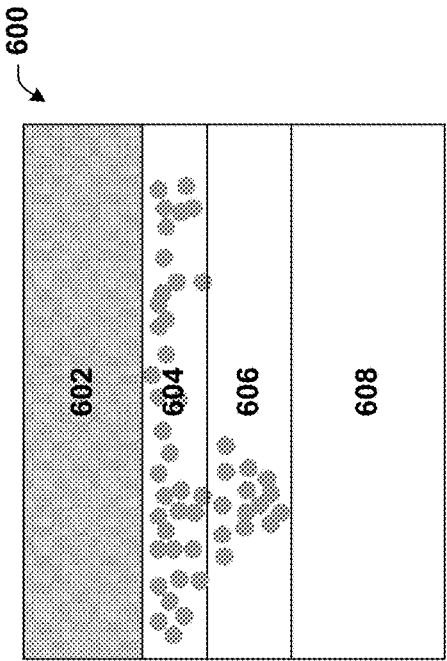
FIGS. 6A-6C depict conductive filament formation and deformation for a memory cell of a disclosed embodiment.
Figure 6B:
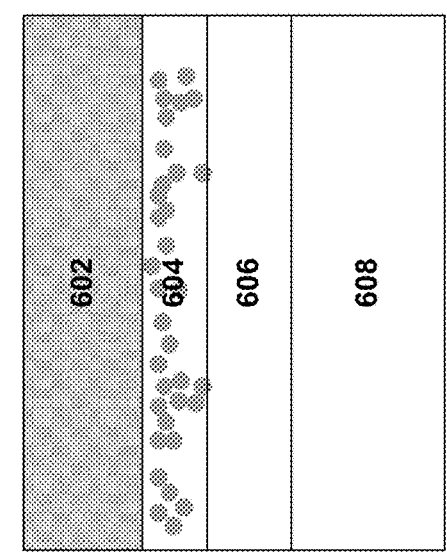
Figure 6C:
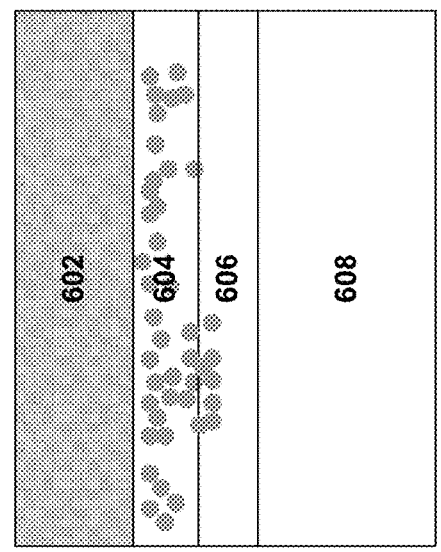

FIGS. 6A-6C depict program and erase functionality of a memory cell 600 according to further embodiments. Memory cell 600 can comprise an active metal layer 602, a blocking layer 604, an interface layer 606 and a contact layer 608, substantially similar to like layers described elsewhere herein (or known in the art). FIG. 6A illustrates an embodiment in which memory cell 600 has been exposed to a high temperature bake process. Metal particles from active metal layer 602 have significantly diffused within blocking layer 604. This diffusion of metal particles within blocking layer 604 can result in blocking layer 604 having an electrical resistivity far lower than an inherent electrical resistivity of the insulating material of blocking layer 604 (e.g., high-k dielectric, oxide, etc.). In some embodiments, blocking layer 604 can have substantially similar electrical resistivity as active metal layer 602 following the high temperature bake process, whereas in other embodiments, diffusion of metal particles within blocking layer 604 following the high temperature bake does not produce electrical continuity from a top surface of blocking layer 604 to a bottom surface of blocking layer 604. In latter embodiments, a forming voltage can be applied to memory cell 600 resulting in a field-induced drift of particles through a remaining (e.g., un-diffused) portion of blocking layer 604.

In one or more embodiments, some diffusion of metal particles can occur into interface layer 606. In such embodiments, however, diffusion into interface layer 606 is not an amount significant to affect electrical resistivity between active metal layer 602 and contact layer 608. In some embodiments, diffusion of active metal particles into blocking layer 604 can be sufficient to cause blocking layer 604 to serve as a source of metal particle drift within interface layer 606 in response to a suitable stimulus (e.g., electric field, current, voltage, etc.) applied to memory cell 600.

FIG. 6B depicts an embodiment of memory cell 600 following a program signal applied across active metal layer 602 and contact layer 608. The program signal can be a voltage within a range of about 1.5 volts to about 3.0 volts, in at least one embodiment, though other voltages suitable to induce formation of a conductive filament through interface layer 606 can be employed in other embodiments within the scope of the subject disclosure. As illustrated, the conductive filament extends from blocking layer 604 to contact layer 608, causing memory cell 600 to enter a low resistance state. FIG. 6C depicts memory cell 600 following application of an erase pulse to memory cell 600. The erase pulse can have an opposite polarity from the program pulse, in an embodiment, and magnitude within a range of about 1.5 to about 3.0 volts. The erase pulse can result in drift of metal ions within interface layer 606 back toward blocking layer 604, and breaking electrical continuity of the conductive filament through the interface layer 606. Following the erase pulse, memory cell 600 is in a high resistance state, substantially equal to an electrical resistance of interface layer 606.

Example Method for Regulating Interface Layer Growth with $NH_3$

The aforementioned diagrams have been described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

Figure 7:
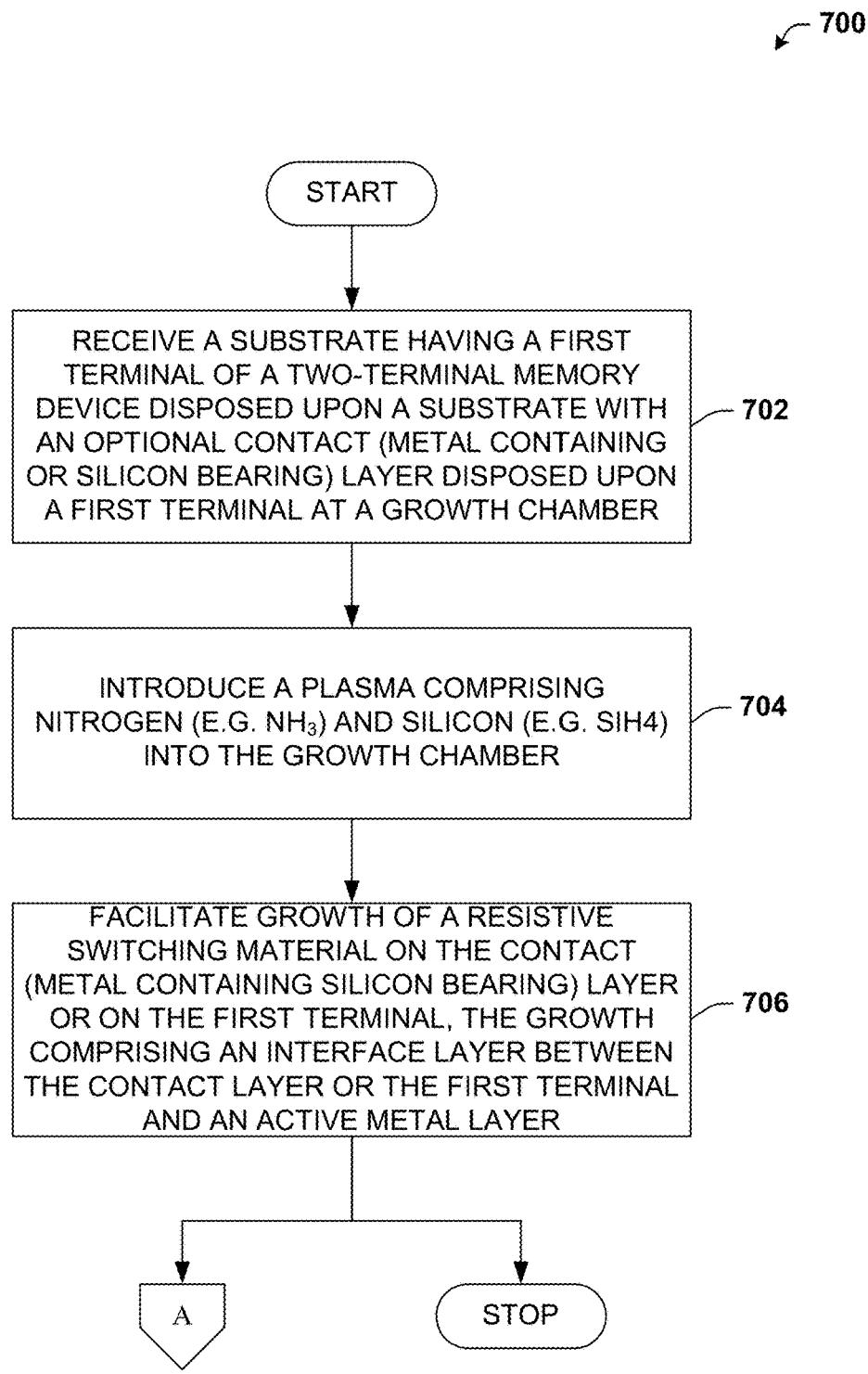
FIG. 7 illustrates an example methodology that can provide for regulating interface layer (e.g. silicon compound) formation (e.g. growth or deposition) with a silicon-containing and a nitrogen-containing (e.g. $NH_3$) plasmas in accordance with certain embodiments of this disclosure.
Figure 8:
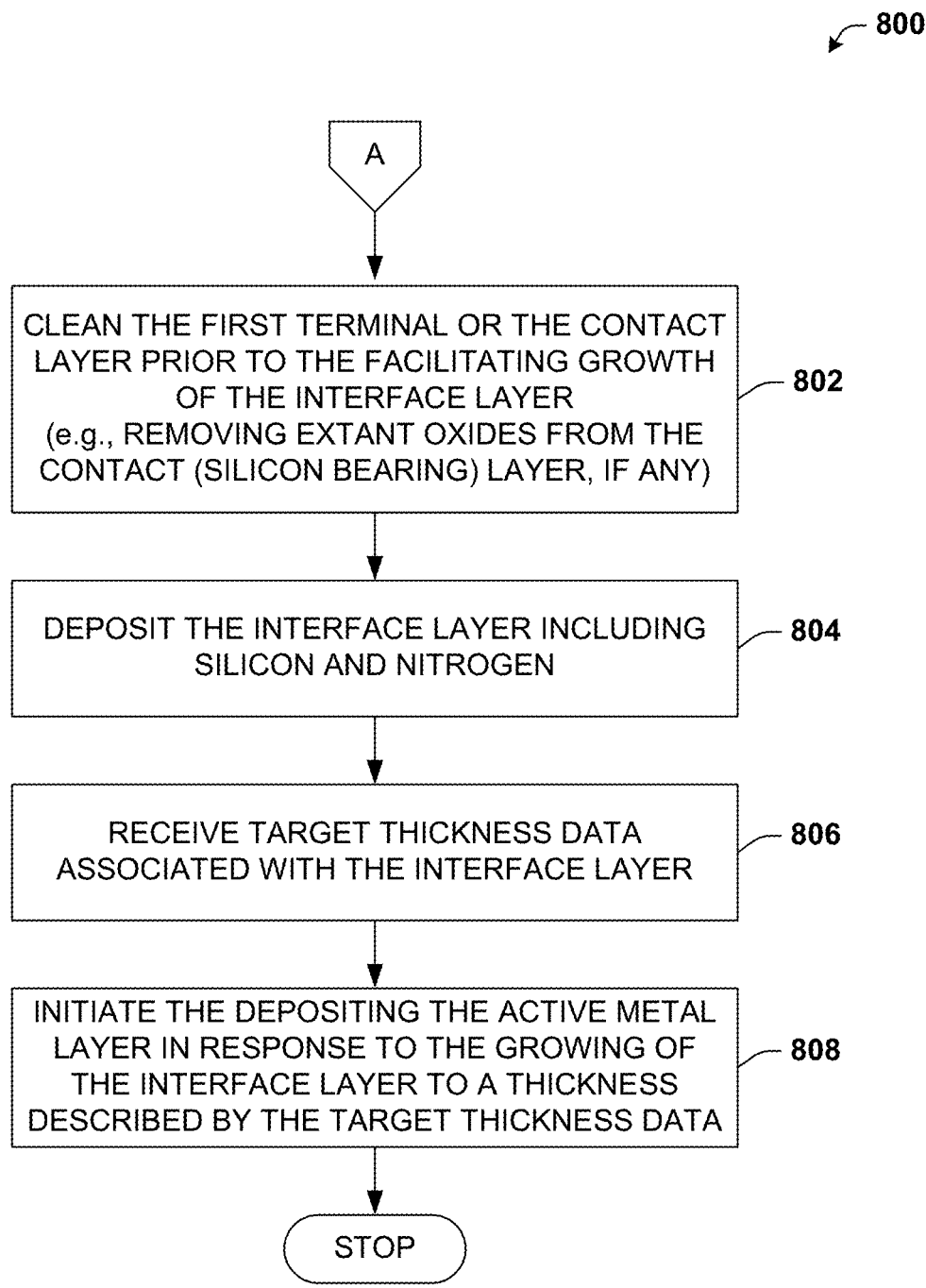
FIG. 8 illustrates an example methodology that can provide for additional features or aspects in connection with regulating interface layer formation (e.g. growth) of a two-terminal memory cell with a silicon-containing and a nitrogen-containing (e.g. $NH_3$) plasmas in accordance with certain embodiments of this disclosure.
Figure 9:
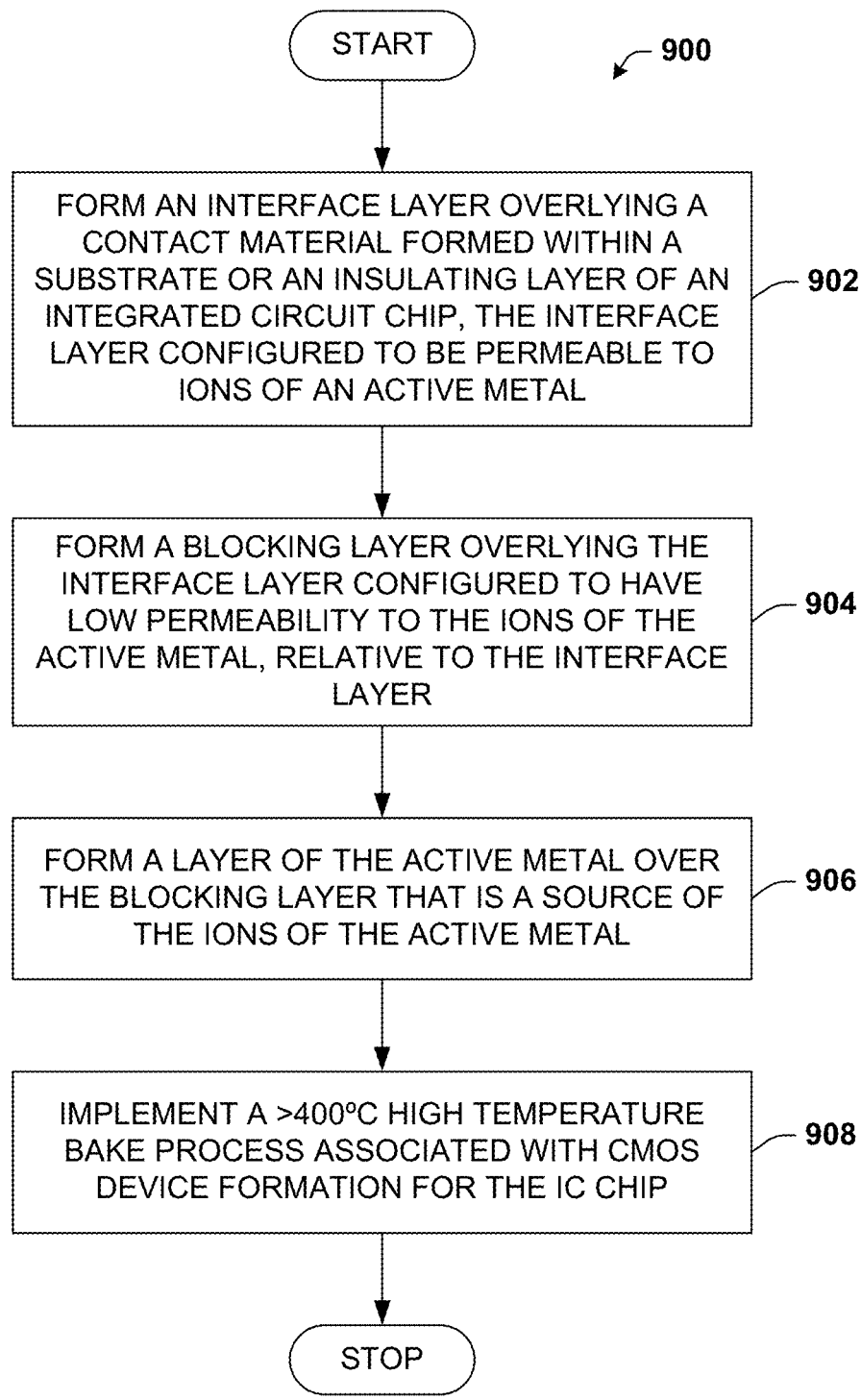
FIG. 9 illustrates a flowchart of a sample method for fabricating a memory cell in one or more alternative or additional embodiments of the disclosure.

In view of the exemplary diagrams described supra, process methods that can be implemented in accordance with the disclosed subject matter will be better appreciated with reference to the flow chart of FIGS. 7-9. While for purposes of simplicity of explanation, the method of FIGS. 7-9 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 7 illustrates exemplary method 700. Method 700 can provide for regulating interface layer growth with silane and $NH_3$ plasma above the first terminal. In an embodiment, the first terminal comprises a material selected from a group consisting of: Aluminum (Al) and Copper (Cu). In another embodiment, the silane can be selected from a group consisting of $Si_nH_{(2n+2)}$. For example, at reference numeral 702, a substrate having a first terminal, described above, optionally including a contact (e.g. metal or silicon bearing) layer associated with a two-terminal memory device, can be received at a growth chamber. In some embodiments, the contact (e.g. silicon bearing, doped polysilicon) layer can exist atop the CMOS substrate, in which case a growth process that occurs at relatively high temperatures (e.g., above 300-450 degrees Celsius) can damage or ruin elements of the CMOS substrate. In some embodiments, other types of contact material (e.g. a barrier material) may be used, or the contact layer may not be used. In some embodiments, the contact layer is a conductive material selected from a group consisting of: titanium containing material, titanium nitride, tantalum nitride, tungsten containing material and titanium tungsten.

At reference numeral 704, a plasma comprising silicon (e.g. $SiH_4$, silane, etc.) and nitrogen (e.g. $NH_3$) can be introduced into the growth chamber. In some embodiments, substantially the entire environment associated with the growth chamber can consist of the $NH_3$ plasma that is introduced.

At reference numeral 706, in one embodiment, growth of the resistive switching can be facilitated by the contact (e.g. silicon bearing) layer. The resistive switching material can constitute an interface layer of the two-terminal memory cell, wherein the interface layer is situated between the contact (e.g. silicon bearing) layer or barrier material layer and an active metal layer. In various embodiments the resistive switching material may include one or a combination of two or more of the following materials: a non-stoichiometric silicon nitride such as silicon sub-nitride, e.g. $SiN_x$, $1<x<1.333$, or the like. As mentioned above, in some embodiments, the resistive switching material may be amorphous in nature and include a plurality of defects where metal materials from the active metal layer become trapped therein and form a conductive filament.

With reference now to FIG. 8, example method 800 is depicted. Method 800 can provide for additional features or aspects in connection with regulating interface layer growth of a two-terminal memory cell with nitrogen (e.g. $NH_3$) plasma. For instance, at reference numeral 802, the contact (e.g. silicon bearing) layer (if used) can be cleaned prior to the facilitating growth of the resistive switching material that can occur in connection with reference numeral 706 of FIG. 7. Cleaning the contact (e.g. silicon bearing) layer can include removing other oxides, contaminants, or other undesired elements that exist on the contact (e.g. metal or silicon bearing) layer prior to the cleaning.

At reference numeral 804, the active metal layer can be deposited over the interface layer. In one or more embodiments the active metal layer comprises a metal, metal compound, or metal alloy, wherein the metal is selected from a group consisting of: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd). By depositing the active metal layer on the interface layer, the growth (e.g. nitrogenation process associated with a silicon nitride being deposited that comprises the interface layer) is concluded. As a result, in some embodiments, deposition of the active metal layer can coincide with the resistive switching material reaching a target thickness, which is further detailed in connection with reference numerals 806 and 808. As discussed previously, in some embodiments, an interface material may be deposited prior to depositing the active metal material in step 804. The deposition of the interface material may also be within the restrictions for CMOS fabrication techniques.

For example, at reference numeral 806, target thickness data associated with the interface layer and/or an oxide comprising the interface layer can be received. At reference numeral 808, the depositing of the active metal layer described with reference to reference numeral 804 can be initiated in response to the oxide growing to a thickness described by the target thickness data.

FIG. 9 depicts a flowchart of a sample method 900 according to further embodiments of the present disclosure. At 902, method 900 can comprise forming an interface layer overlying a contact material formed within a substrate or an insulating layer of an integrated circuit (IC) chip. In various embodiments, the interface layer can be selected to be permeable to ions of an active metal. In an embodiment, the interface layer can be a suitable silicon containing layer. In alternative or additional embodiments, the interface layer can be a silicon nitride material. At 904, method 900 can comprise forming a blocking layer overlying the interface layer configured to have low permeability to the ions of the active metal, relative to the interface layer. In some embodiments, the blocking layer can comprise a high-k dielectric material with good thermal stability, an oxide material, or a nitride material. In some embodiments, the blocking layer can be selected from a group consisting of: $SiO_2$, $Al_2O_3$, $HfO_2$, $ZrO_2$, $Ta_2O_5$, TaO, TiO, $WO_2$, $WO_3$, HfSiO, HfAlO, or a suitable combination of the foregoing. In at least one embodiment, permeability of the blocking layer can be about $1/30^{th}$ the permeability of the interface layer. At 906, method 900 can comprise forming a layer of the active metal over the blocking layer that is a source of the ions of the active metal. In various embodiments, the active metal can comprise silver (Ag), copper (Cu), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations, alloys, of the foregoing (e.g. a metal nitride) can be selected for the active metal in some aspects of the subject disclosure. In one or more other embodiments, the active metal material can comprise a suitable compound of Al, Ti, Ag or Cu, together with nitrogen or oxygen. For instance, the active metal can include AlN, TiN, Cu sub-oxide ($CuO_x$, where $0<x<2$) in at least one embodiment. In at least one embodiment, the interface layer can comprise SiN, the blocking layer can comprise hafnium oxide, zirconium oxide and titanium oxide, and the active metal layer can comprise AlN, TiN, or Cu sub-oxide. At 908, method 900 can comprise implementing a >400 degree Celsius high temperature bake process associated with formation of a CMOS device of the IC chip.

Example Operating Environments

Figure 10:
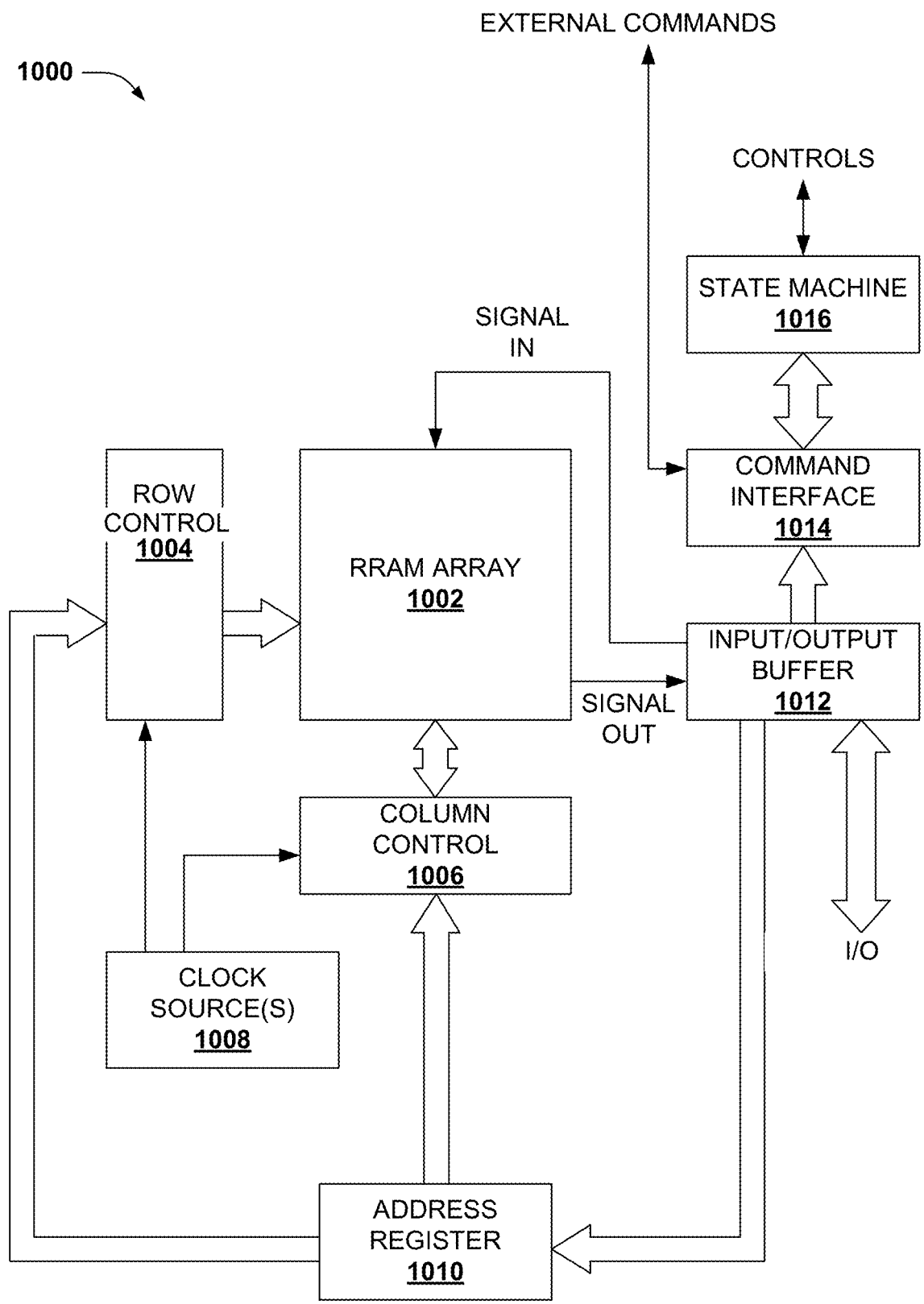
FIG. 10 illustrates a block diagram of an example electronic operating environment in accordance with certain embodiments of this disclosure.
Figure 11:
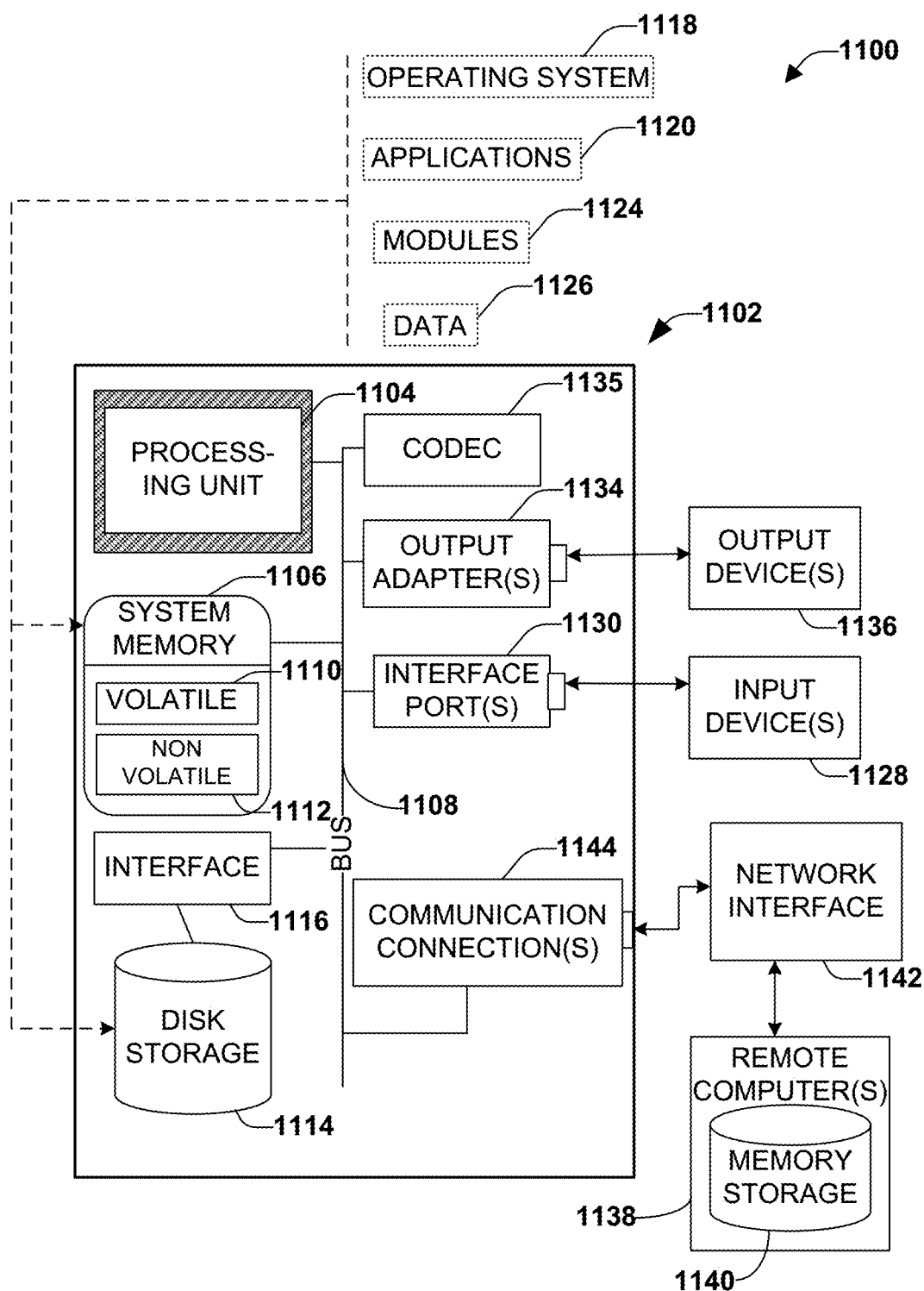
FIG. 11 illustrates an example schematic block diagram for a computing environment in accordance with certain embodiments of this disclosure.

In order to provide a context for the various aspects of the disclosed subject matter, FIGS. 10 and 11, as well as the following discussion, are intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 10 illustrates a block diagram of an example operating and control environment 1000 for a RRAM array 1002 according to aspects of the subject disclosure. In at least one aspect of the subject disclosure, RRAM array 1002 can comprise a variety of RRAM memory cell technology. Particularly, RRAM array can be configured or operated to mitigate or avoid sneak path currents of the RRAM array, as described herein.

A column controller 1006 can be formed adjacent to RRAM array 1002. Moreover, column controller 1006 can be electrically coupled with bit lines of RRAM array 1002. Column controller 1006 can control respective bitlines, applying suitable program, erase or read voltages to selected bitlines.

In addition, operating and control environment 1000 can comprise a row controller 1004. Row controller 1004 can be formed adjacent to column controller 1006, and electrically connected with word lines of RRAM array 1002. Row controller 1004 can select particular rows of memory cells with a suitable selection voltage. Moreover, row controller 1004 can facilitate program, erase or read operations by applying suitable voltages at selected word lines.

A clock source(s) 1008 can provide respective clock pulses to facilitate timing for read, write, and program operations of row control 1004 and column control 1006. Clock source(s) 1008 can further facilitate selection of word lines or bit lines in response to external or internal commands received by operating and control environment 1000. An input/output buffer 1012 can be connected to an external host apparatus, such as a computer or other processing device (not depicted) by way of an I/O buffer or other I/O communication interface. Input/output buffer 1012 can be configured to receive write data, receive an erase instruction, output readout data, and receive address data and command data, as well as address data for respective instructions. Address data can be transferred to row controller 1004 and column controller 1006 by an address register 1010. In addition, input data is transmitted to RRAM array 1002 via signal input lines, and output data is received from RRAM array 1002 via signal output lines. Input data can be received from the host apparatus, and output data can be delivered to the host apparatus via the I/O buffer.

Commands received from the host apparatus can be provided to a command interface 1014. Command interface 1014 can be configured to receive external control signals from the host apparatus, and determine whether data input to the input/output buffer 1012 is write data, a command, or an address. Input commands can be transferred to a state machine 1016.

State machine 1016 can be configured to manage programming and reprogramming of RRAM array 1002. State machine 1016 receives commands from the host apparatus via input/output interface 1012 and command interface 1014, and manages read, write, erase, data input, data output, and like functionality associated with RRAM array 1002. In some aspects, state machine 1016 can send and receive acknowledgments and negative acknowledgments regarding successful receipt or execution of various commands.

To implement read, write, erase, input, output, etc., functionality, state machine 1016 can control clock source(s) 1008. Control of clock source(s) 1008 can cause output pulses configured to facilitate row controller 1004 and column controller 1006 implementing the particular functionality. Output pulses can be transferred to selected bit lines by column controller 1006, for instance, or word lines by row controller 1004, for instance.

In connection with FIG. 11, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 11, a suitable environment 1100 for implementing various aspects of the claimed subject matter includes a computer 1102. The computer 1102 includes a processing unit 1104, a system memory 1106, a codec 1135, and a system bus 1108. The system bus 1108 couples system components including, but not limited to, the system memory 1106 to the processing unit 1104. The processing unit 1104 can be any of various available processors. Dual microprocessors and other multiprocessor architectures also can be employed as the processing unit 1104.

The system bus 1108 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1106 includes volatile memory 1110 and non-volatile memory 1112. The basic input/output system (BIOS), containing the basic routines to transfer information between elements within the computer 1102, such as during start-up, is stored in non-volatile memory 1112. In addition, according to present innovations, codec 1135 may include at least one of an encoder or decoder, wherein the at least one of an encoder or decoder may consist of hardware, software, or a combination of hardware and software. Although, codec 1135 is depicted as a separate component, codec 1135 may be contained within non-volatile memory 1112. By way of illustration, and not limitation, non-volatile memory 1112 can include read only memory (ROM), programmable ROM (PROM), electrically programmable ROM (EPROM), electrically erasable programmable ROM (EEPROM), or flash memory. Volatile memory 1110 includes random access memory (RAM), which acts as external cache memory. According to present aspects, the volatile memory may store the write operation retry logic (not shown in FIG. 11) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1102 may also include removable/non-removable, volatile/non-volatile computer storage medium. FIG. 11 illustrates, for example, disk storage 1114. Disk storage 1114 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1114 to the system bus 1108, a removable or non-removable interface is typically used, such as interface 1116. It is appreciated that storage devices 1114 can store information related to a user. Such information might be stored at or provided to a server or to an application running on a user device. In one embodiment, the user can be notified (e.g., by way of output device(s) 1136) of the types of information that are stored to disk storage 1114 and/or transmitted to the server or application. The user can be provided the opportunity to opt-in or opt-out of having such information collected and/or shared with the server or application (e.g., by way of input from input device(s) 1128).

It is to be appreciated that FIG. 11 describes software that acts as an intermediary between users and the basic computer resources described in the suitable operating environment 1100. Such software includes an operating system 1118. Operating system 1118, which can be stored on disk storage 1114, acts to control and allocate resources of the computer system 1102. Applications 1120 take advantage of the management of resources by operating system 1118 through program modules 1124, and program data 1126, such as the boot/shutdown transaction table and the like, stored either in system memory 1106 or on disk storage 1114. It is to be appreciated that the claimed subject matter can be implemented with various operating systems or combinations of operating systems.

A user enters commands or information into the computer 1102 through input device(s) 1128. Input devices 1128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1104 through the system bus 1108 via interface port(s) 1130. Interface port(s) 1130 include, for example, a serial port, a parallel port, a game port, and a universal serial bus (USB). Output device(s) 1136 use some of the same type of ports as input device(s) 1128. Thus, for example, a USB port may be used to provide input to computer 1102 and to output information from computer 1102 to an output device 1136. Output adapter 1134 is provided to illustrate that there are some output devices 1136 like monitors, speakers, and printers, among other output devices 1136, which require special adapters. The output adapters 1134 include, by way of illustration and not limitation, video and sound cards that provide a means of connection between the output device 1136 and the system bus 1108. It should be noted that other devices and/or systems of devices provide both input and output capabilities such as remote computer(s) 1138.

Computer 1102 can operate in a networked environment using logical connections to one or more remote computers, such as remote computer(s) 1138. The remote computer(s) 1138 can be a personal computer, a server, a router, a network PC, a workstation, a microprocessor based appliance, a peer device, a smart phone, a tablet, or other network node, and typically includes many of the elements described relative to computer 1102. For purposes of brevity, only a memory storage device 1140 is illustrated with remote computer(s) 1138. Remote computer(s) 1138 is logically connected to computer 1102 through a network interface 1142 and then connected via communication connection(s) 1144. Network interface 1142 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1144 refers to the hardware/software employed to connect the network interface 1142 to the bus 1108. While communication connection 1144 is shown for illustrative clarity inside computer 1102, it can also be external to computer 1102. The hardware/software necessary for connection to the network interface 1142 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for forming a semiconductor device including a reversibly switchable bipolar resistive switching memory cell, comprising:
    providing a complementary metal oxide semiconductor (CMOS) substrate having a first terminal of the reversibly switchable bipolar resistive switching memory cell formed thereon;
    forming a conductive material layer upon the first terminal;
    forming in a processing chamber including silane plasma and ammonia ($NH_3$) plasma, a resistive switching material layer comprising a non-stoichiometric silicon sub-nitride upon the conductive material layer;
    forming a blocking layer overlying the resistive switching material layer;
    forming an active metal layer comprising an active metal material overlying the blocking layer, and
    providing a high temperature bake of equal to or greater than 400 degrees Celsius to the semiconductor device and inducing diffusion of metal particles from the active metal material into the blocking layer and only in part into the resistive switching material layer near a boundary of the blocking layer and the resistive switching material layer and wherein a majority of the metal particles remain wholly within the blocking layer in response to the high temperature bake, wherein:
    the active metal material is selected from a group consisting of: AlN, Ti, TiN and a non-stoichiometric Cu sub-oxide having a chemical formula: $CuO_x$ where $0<x<2$,
    the blocking layer has a first diffusivity to metal ions of the active metal material and the resistive switching material layer has a second diffusivity to the metal ions of the active metal material, wherein the first diffusivity is lower than the second diffusivity.

2. The method of claim 1, wherein the conductive material layer is formed of a conductive material selected from a group consisting of: a titanium containing material, titanium nitride, tantalum nitride, a tungsten containing material, and titanium tungsten.

3. The method of claim 1, wherein the first terminal comprises a material selected from a group consisting of: Aluminum (Al) and Copper (Cu).

4. The method of claim 1, wherein at least one of the following:
    the non-stoichiometric silicon sub-nitride comprises: $Si_xN_y$, where $x<y<x+1$;
    the silane is selected from a group consisting of $Si_nH_{(2n+2)}$; or
    the forming in the processing chamber including the silane plasma and the $NH_3$ plasma, the resistive switching material layer further comprises using a CMOS-related temperature-compatible formation process.

5. The method of claim 1, wherein the first diffusivity of the blocking layer is about 30 times smaller than the second diffusivity of the resistive switching material layer.

6. The method of claim 1, further comprising:
    forming a first dielectric layer above the first terminal; and
    etching a first via in the first dielectric layer to expose a portion of the first terminal;
    wherein forming the conductive material layer comprises forming the conductive material layer above a portion of the first dielectric layer, in the first via, and in contact with the portion of the first terminal.

7. The method of claim 6, further comprising:
    forming a barrier material layer upon the active metal layer;
    etching the resistive switching material layer, the active metal layer and the barrier material layer to form a pillar structure;
    forming a second dielectric layer above and around the pillar structure;
    exposing at least a portion of a top of the pillar structure; and
    forming a second terminal in contact with the top of the pillar structure.

8. A method for forming a reversibly switchable bipolar resistive memory device, comprising:

receiving a CMOS substrate having a first terminal of the reversibly switchable bipolar resistive memory device formed thereon;

forming a conductive material layer upon the first terminal;

depositing in a processing chamber including silane plasma and ammonia ($NH_3$) plasma, a resistive switching material layer comprising a non-stoichiometric silicon sub-nitride upon the conductive material layer;

forming a blocking layer overlying the resistive switching material layer;

forming an active metal layer overlying the blocking layer, wherein the blocking layer has a first diffusivity to metal ions of the active metal layer and the resistive switching material layer has a second diffusivity to the metal ions of the active metal layer, wherein the first diffusivity is lower than the second diffusivity;

heating the processing chamber to a temperature equal to or greater than 400 degrees Celsius and inducing diffusion of metal particles of the active metal layer within the blocking layer and only partially within the resistive switching material layer near a boundary of the resistive switching material layer and the blocking layer and wherein a majority of the metal particles remain wholly within the blocking layer; and disposing a second terminal upon the active metal layer, wherein the first terminal and the second terminal are two terminals of the reversibly switchable bipolar resistive memory device.

9. The method of claim 8, wherein:

the active metal layer comprises a metal, a metal compound or a metal alloy, wherein the metal is selected from a group consisting of: silver (Ag), gold (Au), titanium (Ti), copper (Cu), nickel (Ni), aluminum (Al), chromium (Cr), tantalum (Ta), iron (Fe), manganese (Mn), tungsten (W), vanadium (V), cobalt (Co), platinum (Pt), and palladium (Pd); and wherein the metal compound is a compound of nitrogen or oxygen.

10. The method of claim 8, further comprising:

forming an oxide layer above the conductive material layer;

forming a central aperture in the oxide layer to expose at least a portion of the conductive material layer;

wherein depositing in the processing chamber including the silane plasma and the $NH_3$ plasma, the resistive switching material layer further comprises depositing the resistive switching material layer in the central aperture in the oxide layer;

wherein forming the active metal layer comprises forming the active metal layer upon the resistive switching material layer in the central aperture; and further comprising etching the active metal layer and the resistive switching material layer.

11. The method of claim 1, wherein the blocking layer comprises a material selected from a second group consisting of: $Al_2O_3$, $HfO_2$, $ZrO_2$, $Ta_2O_5$, TaO, $WO_2$, $WO_3$, HfSiO, HfAlO and TiO.

12. The method of claim 11, wherein the material of the blocking layer is selected from a third group consisting of: $HfO_2$ and TiO.

13. The method of claim 1, further comprising forming a barrier layer overlying the active metal material, wherein the barrier layer is selected from a second group consisting of: Ti, TiN, TaN, W and TiW.

14. The method of claim 8, wherein the blocking layer comprises a material selected from a group consisting of: $Al_2O_3$, $HfO_2$, $ZrO_2$, $Ta_2O_5$, TaO, $WO_2$, $WO_3$, HfSiO, HfAlO and TiO.

15. The method of claim 14, wherein the blocking layer comprises a material selected from a second group consisting of: $HfO_2$ and TiO.

16. The method of claim 8, further comprising forming a barrier layer overlying the active metal material, wherein the barrier layer is selected from a second group consisting of: Ti, TiN, TaN, W and TiW.

17. The method of claim 16, further comprising:

etching the resistive switching material layer, the active metal layer and the barrier material layer to form a pillar structure;

forming a second dielectric layer above and around the pillar structure;

exposing at least a portion of a top surface of the pillar structure, and wherein disposing the second terminal upon the active metal layer further comprises forming a second conductive material layer overlying the pillar structure and in electrical contact with the barrier material layer and the active metal layer.

18. The method of claim 8, wherein the first diffusivity of the blocking layer is about 30 times smaller than the second diffusivity of the resistive switching material layer.

19. The method of claim 8, wherein the non-stoichiometric silicon sub-nitride comprises $Si_xN_y$ where $x<y<1$.

20. The method of claim 8, wherein the silane plasma is selected from a group consisting of $Si_nH_{(2n+1)}$.

* * * * *